(12) United States Patent
Tilton et al.

(10) Patent No.: US 7,044,768 B1
(45) Date of Patent: May 16, 2006

(54) LIQUID THERMAL MANAGEMENT SOCKET SYSTEM

(75) Inventors: Donald E. Tilton, Colton, WA (US); Paul A. Knight, Spokane, WA (US); David H. Knaggs, Mead, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 0 days.

(21) Appl. No.: 10/693,671

(22) Filed: Oct. 23, 2003

(51) Int. Cl.
*H01R 13/00* (2006.01)

(52) U.S. Cl. ...................................... 439/485; 439/196
(58) Field of Classification Search .................. 439/70, 439/196, 331, 485 I, 487
See application file for complete search history.

(56) References Cited

U.S. PATENT DOCUMENTS

| | | | | |
|---|---|---|---|---|
| 5,475,317 A * | 12/1995 | Smith | ...................... | 324/760 |
| 5,702,256 A * | 12/1997 | Severn | ...................... | 439/71 |
| 6,054,676 A * | 4/2000 | Wall et al. | ................... | 219/209 |
| 6,410,982 B1 * | 6/2002 | Brownell et al. | ........... | 257/714 |
| 6,469,895 B1 * | 10/2002 | Smith et al. | ................. | 361/704 |
| 6,529,378 B1 * | 3/2003 | Wong et al. | ................. | 361/704 |
| 6,543,246 B1 * | 4/2003 | Wayburn et al. | ........... | 62/259.2 |
| 6,672,881 B1 * | 1/2004 | Evans | ......................... | 439/71 |
| 6,712,621 B1 * | 3/2004 | Li et al. | ...................... | 439/65 |
| 6,752,204 B1 * | 6/2004 | Dishongh et al. | ........... | 165/185 |
| 6,932,635 B1 * | 8/2005 | Ishikawa et al. | ............ | 439/190 |

* cited by examiner

*Primary Examiner*—Thanh-Tam Le
(74) *Attorney, Agent, or Firm*—Michael Neustel

(57) ABSTRACT

A liquid thermal management socket system for thermally managing an electronic device in a socket. The liquid thermal management socket system includes a thermal management unit having a chamber for receiving one or more electronic devices, a plurality of first connectors within the thermal management unit for electrically coupling with the electronic device, and a plurality of second connectors electrically coupled to the first connectors, wherein the second connectors extend from the thermal management unit for electrically coupling within a socket unit on a board. The thermal management unit may have a cap member attachable to a base portion in a sealed manner. The chamber within the thermal management unit may thermally manage an electronic device within via spray cooling, liquid immersion or other liquid cooling method.

15 Claims, 16 Drawing Sheets

LIQUID THERMAL MANAGEMENT SOCKET SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to thermal management systems for electronic devices and more specifically it relates to a liquid thermal management socket system for thermally managing an electronic device in a socket.

2. Description of the Related Art

Electronic devices removably positioned within sockets have been in use for years. Sockets allow for efficient replacement and upgrading of electronic devices (e.g. microprocessors). FIG. 1b illustrates an exemplary socket unit (14) attached to a circuit board (12) (e.g. motherboard, expansion board) that has a plurality of socket receptacles (15) for receiving the device connectors of an electronic device. FIG. 1a illustrates an exemplary configuration of an electronic device (16) coupled to a socket unit (14) with a heat sink (18) thermally coupled to the electronic device by a layer of thermal interface material (17) to allow for air cooling of the electronic device.

While conventional "air cooling" of electronic devices, air cooling is not desired an efficient method of thermally managing modern high-power electronics which have high thermal management requirements. In addition, air cooling is sometimes not capable of adequately thermally managing modern electronic devices with high heat flux areas resulting in reduced efficiency and possibly failure of the electronic device.

Liquid thermal management systems are the most promising technology for thermally managing modern electronic devices. Liquid cold plates, liquid immersion and spray cooling are the three most commonly utilized liquid thermal management systems. Liquid immersion and spray cooling are typically more efficient than liquid cold plates. Liquid immersion involves applying a dielectric liquid coolant directly over one or more electronic devices. Spray cooling involves spraying a dielectric liquid coolant onto one or more electronic devices. An exemplary spray cooling system is described in U.S. Pat. No. 5,420,804 to Tilton et al., and is hereby incorporated by reference. Hence, it is desirable to utilize either liquid immersion or spray cooling in the thermal management of modern electronic devices.

While liquid thermal management systems have significant performance advantages over air cooled systems, there are some inherent problems. One of the problems with conventional liquid thermal management systems is that they sometimes require modifications by board manufacturers or electronic device manufacturers. A further problem with conventional liquid thermal management systems is that they are not easily integrated within the form factor of standard air cooled sockets. Another problem with conventional liquid thermal management systems is that they do not have an industry form factor as air cooled systems do.

In these respects, the liquid thermal management socket system according to the present invention substantially departs from the conventional concepts and designs of the prior art, and in so doing provides an apparatus primarily developed for the purpose of thermally managing an electronic device in a socket.

BRIEF SUMMARY OF THE INVENTION

In view of the foregoing disadvantages inherent in the known types of liquid thermal management systems now present in the prior art, the present invention provides a new liquid thermal management socket system construction wherein the same can be utilized for thermally managing an electronic device in a socket.

The general purpose of the present invention, which will be described subsequently in greater detail, is to provide a new liquid thermal management socket system that has many of the advantages of the liquid thermal management systems mentioned heretofore and many novel features that result in a new liquid thermal management socket system which is not anticipated, rendered obvious, suggested, or even implied by any of the prior art liquid thermal management systems, either alone or in any combination thereof.

To attain this, the present invention generally comprises a thermal management unit having a chamber for receiving one or more electronic devices, a plurality of first connectors within the thermal management unit for electrically coupling with the electronic device, and a plurality of second connectors electrically coupled to the first connectors, wherein the second connectors extend from the thermal management unit for electrically coupling within a socket unit on a board. The thermal management unit may have a cap member attachable to a base portion in a sealed manner. The chamber within the thermal management unit may thermally manage an electronic device within via spray cooling, liquid immersion or other liquid cooling method.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a liquid thermal management socket system that will overcome the shortcomings of the prior art devices.

A second object is to provide a liquid thermal management socket system for thermally managing an electronic device in a socket.

Another object is to provide a liquid thermal management socket system that can be utilized within air cooled sockets.

An additional object is to provide a liquid thermal management socket system that reduces the costs of utilizing liquid thermal management systems.

A further object is to provide a liquid thermal management socket system that does not require any modifications to a board or a socket.

Another object is to provide a liquid thermal management socket system that can be utilized with respect to various electronic device and socket coupler systems.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1A:
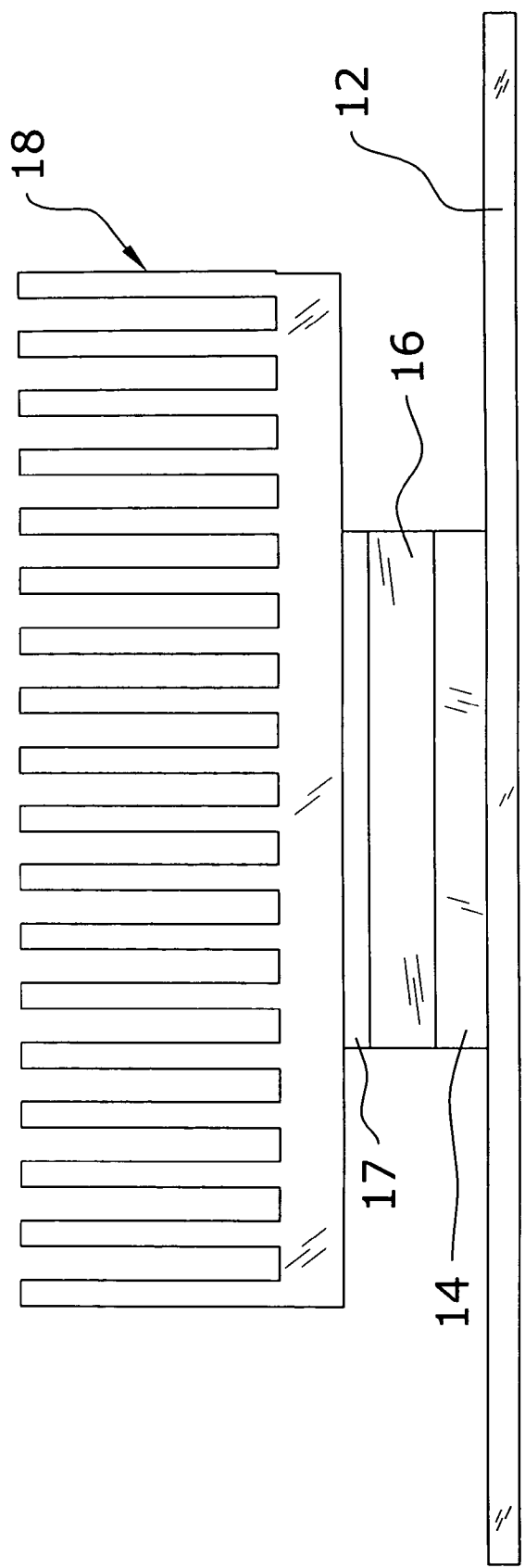
FIG. 1a is a side view of a conventional socket unit with an electronic device coupled to the socket unit along with a heat sink.
Figure 1B:
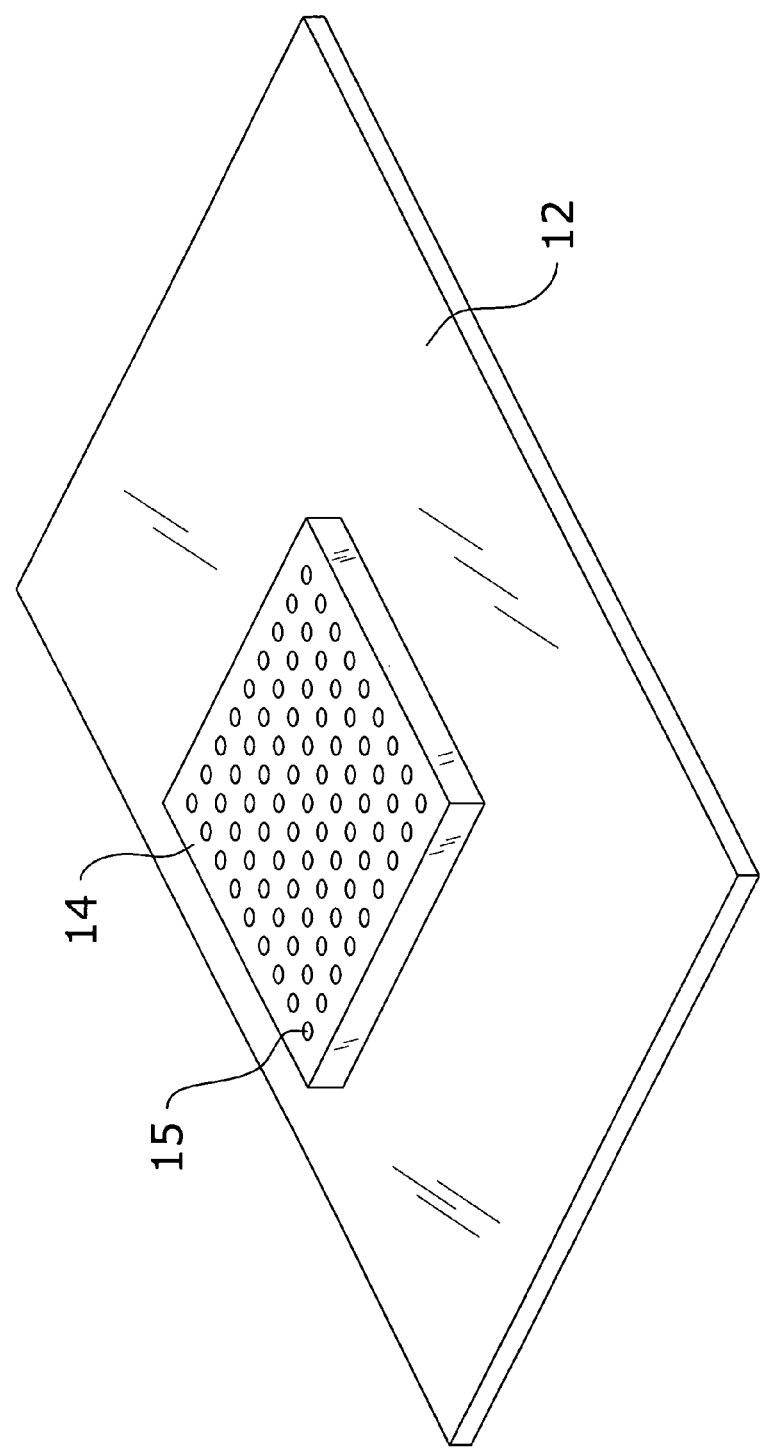
FIG. 1b is an upper perspective view of a conventional socket unit attached to a circuit board.

Turning now descriptively to the drawings, in which similar reference characters denote similar elements throughout the several views, FIGS. 3 through 15 illustrate a liquid thermal management socket system 10, which comprises a thermal management unit 20 having a chamber 50 for receiving one or more electronic devices 16, a plurality of first connectors 32 within the thermal management unit 20 for electrically coupling with the electronic device 16, and a plurality of second connectors 34 electrically coupled to the first connectors 32, wherein the second connectors 34 extend from the thermal management unit 20 for electrically coupling within a socket unit 14 on a board 12. The thermal management unit 20 may have a cap member 40 attachable to a base portion 30 in a sealed manner. The chamber 50 within the thermal management unit 20 may thermally manage an electronic device 16 within via spray cooling, liquid immersion or other liquid cooling method.

B. Thermal Management Unit

Figure 7:
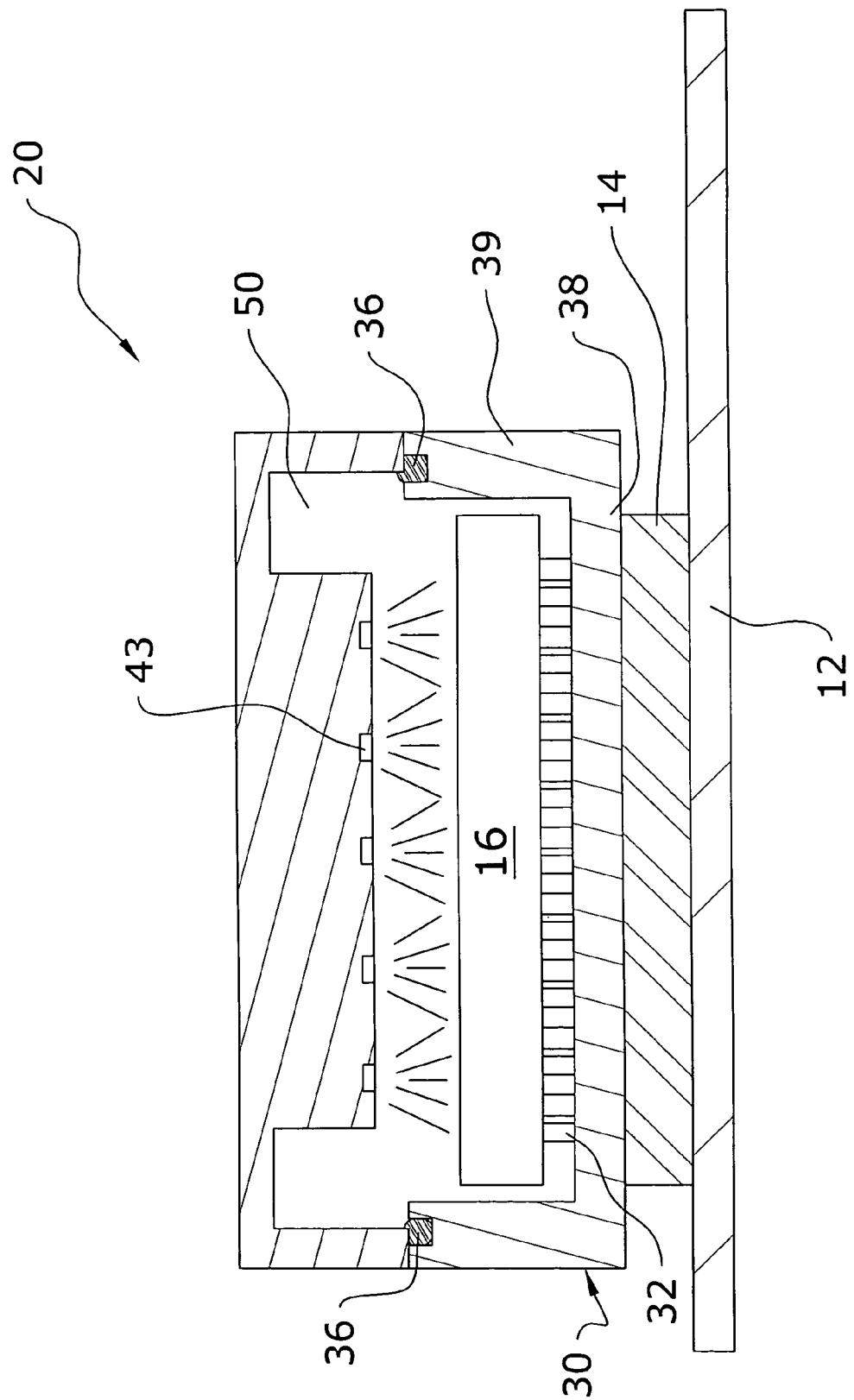
FIG. 7 is a side cutaway view of the present invention utilized in a spray cooling application.
Figure 8:
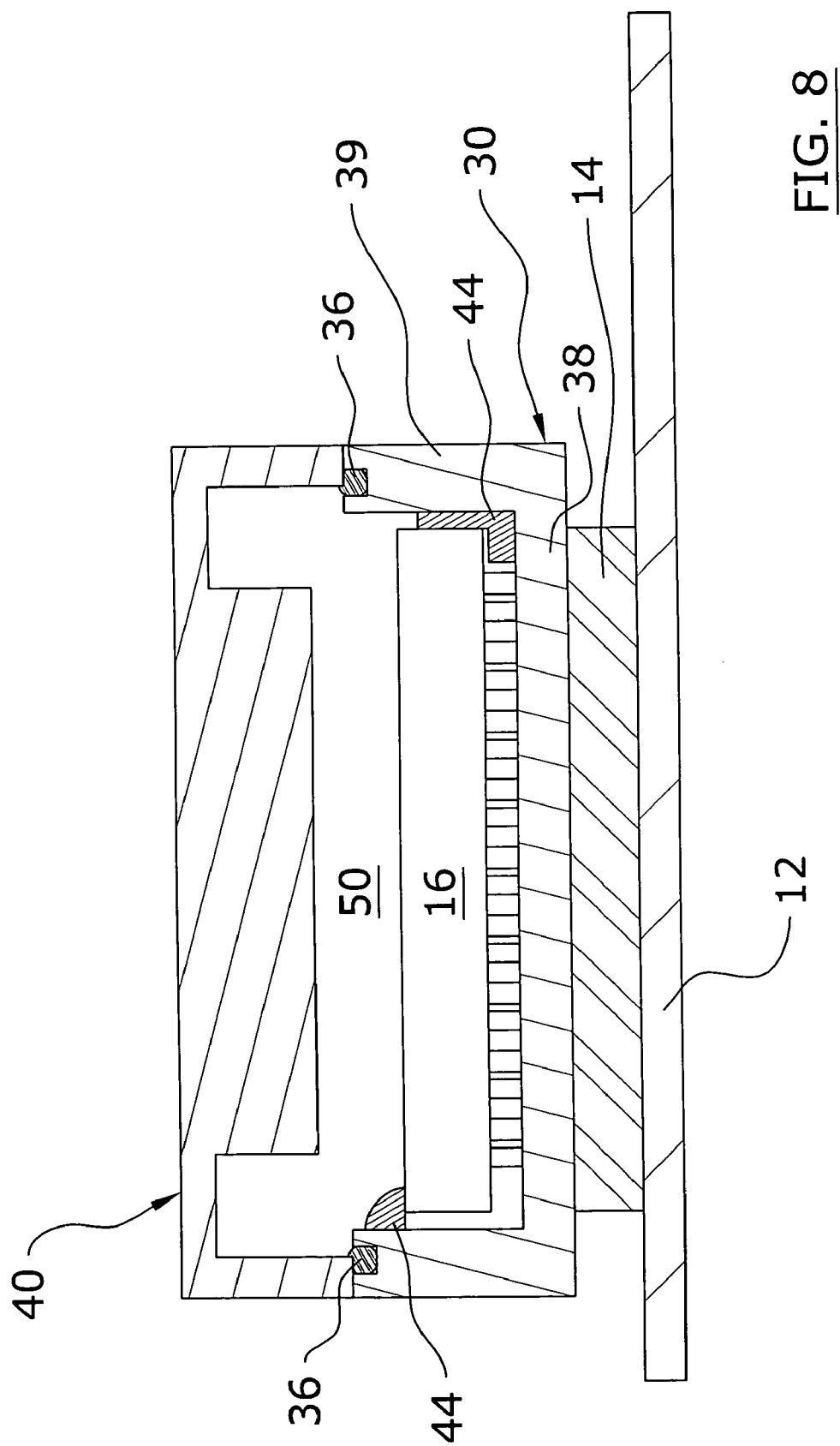
FIG. 8 is a side cutaway view of the present invention utilized in a liquid immersion application.

The thermal management unit 20 has a chamber 50 capable of receiving one or more electronic devices 16 (e.g. semiconductor chips, microprocessors, integrated circuit devices, power conversion devices, laser diodes, memory devices, etc.) as shown in FIGS. 7 and 8 of the drawings. The chamber 50 is fluidly connected to a liquid thermal management system 60 where a liquid coolant is applied (spray form, liquid immersion, etc.) to the electronic device 16 for thermally managing the electronic device 16. Thermal management of the electronic device 16 may include maintaining, lowering or increasing the temperature of the electronic device 16.

The thermal management unit 20 may be comprised of various structures capable of receiving and thermally managing one or more electronic devices 16. For example, the thermal management unit 20 could be comprised of a structure with an electronic device 16 permanently and non-removably positioned within the chamber 50.

FIGS. 2 through 8 illustrate the usage of a base portion 30 and a cap member 40 removably attachable to the base portion 30. The cap member 40 and the base portion 30 together form the chamber 50 where the electronic device 16 is positioned and thermally managed as shown in FIGS. 7 and 8 of the drawings. Additional discussion regarding the base portion 30 and the cap member 40 is below. It can be appreciated that various other structures may be utilized to construct the thermal management unit 20 other than shown in the figures and that the scope of the present invention should not be limited solely to the structure shown in the figures.

Figure 2:
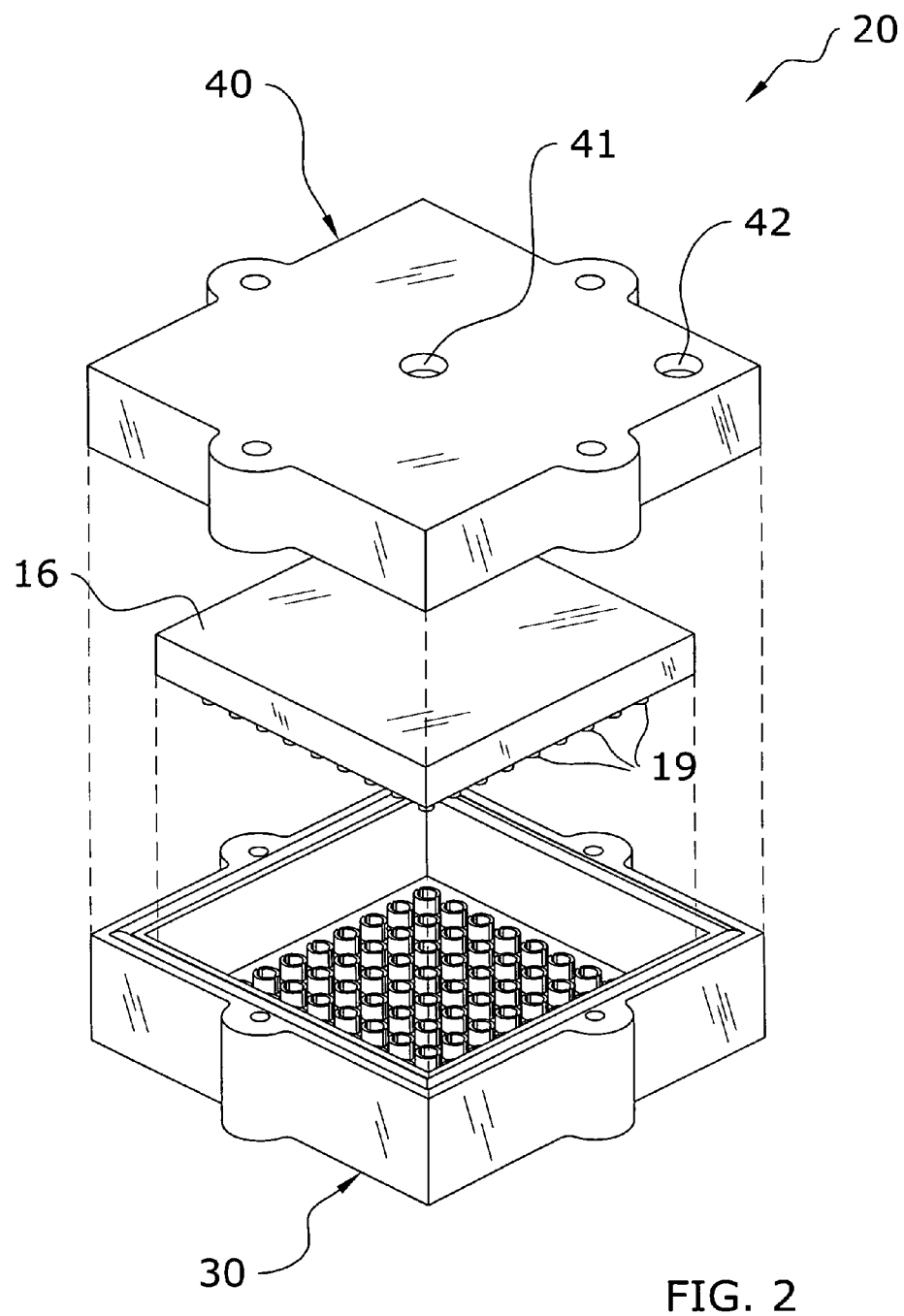
FIG. 2 is an exploded upper perspective view of the present invention.
Figure 3:
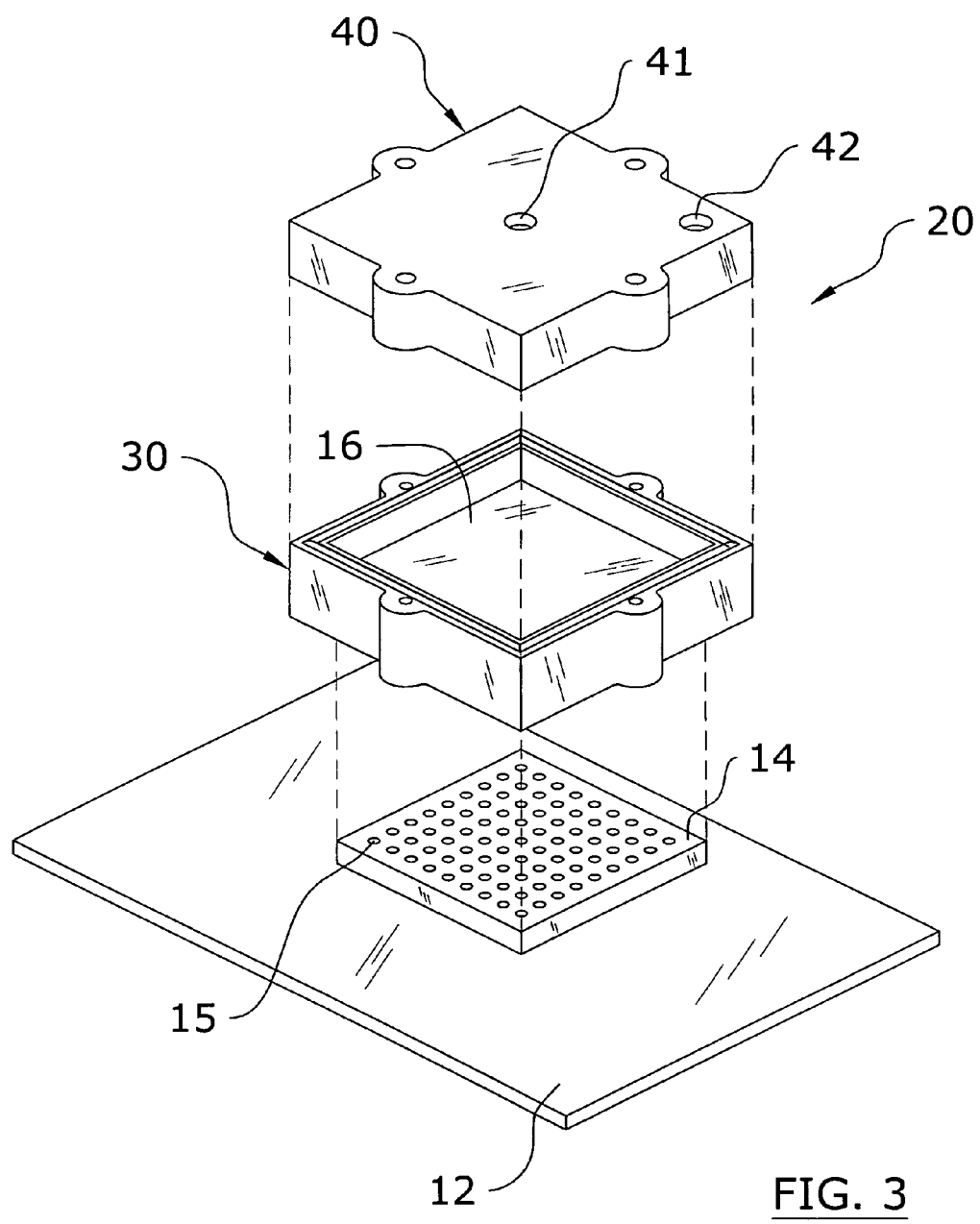
FIG. 3 is an exploded upper perspective view of the present invention with respect to a socket unit.
Figure 9:
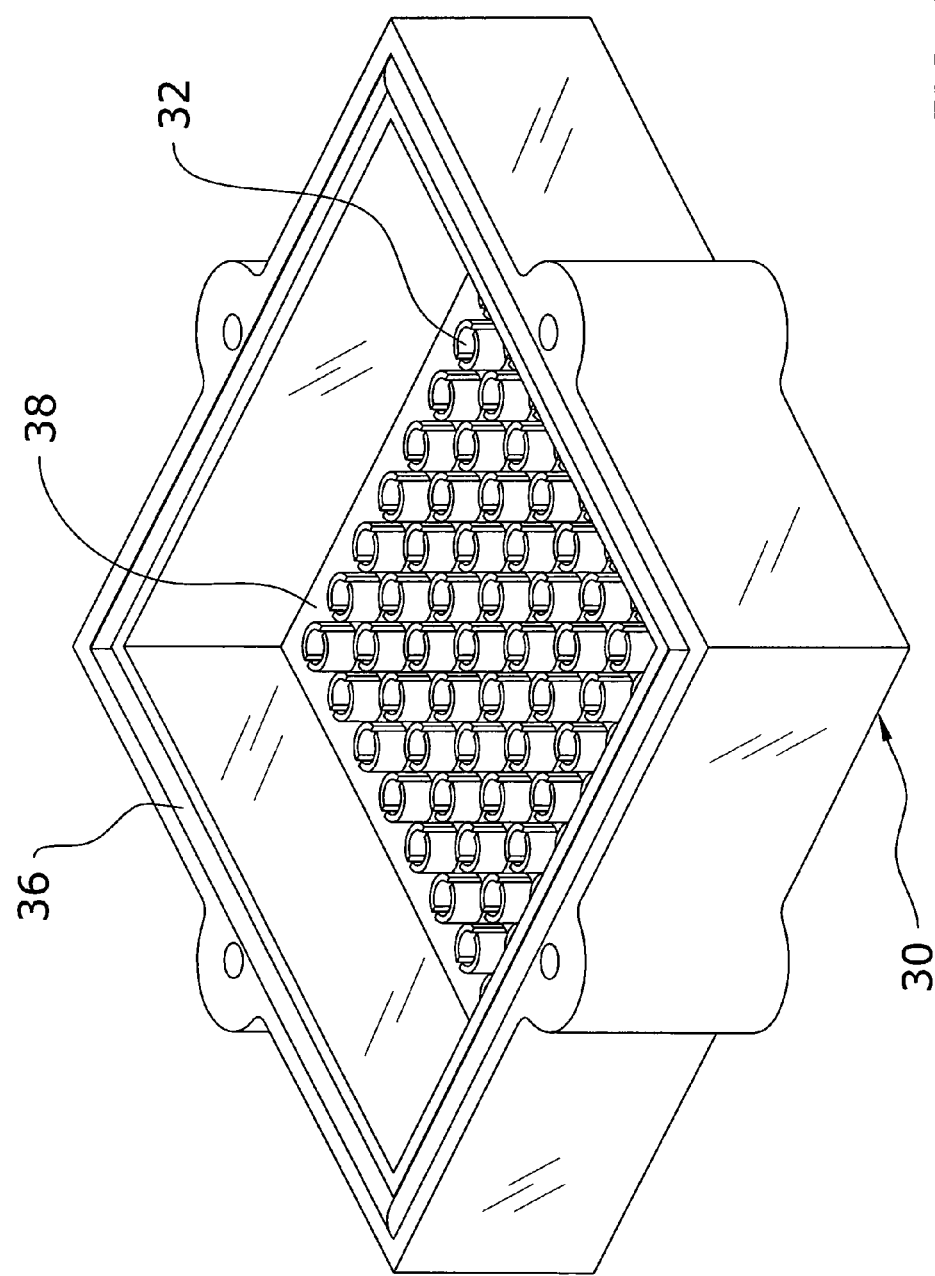
FIG. 9 is an upper perspective view of the base portion.
Figure 11:
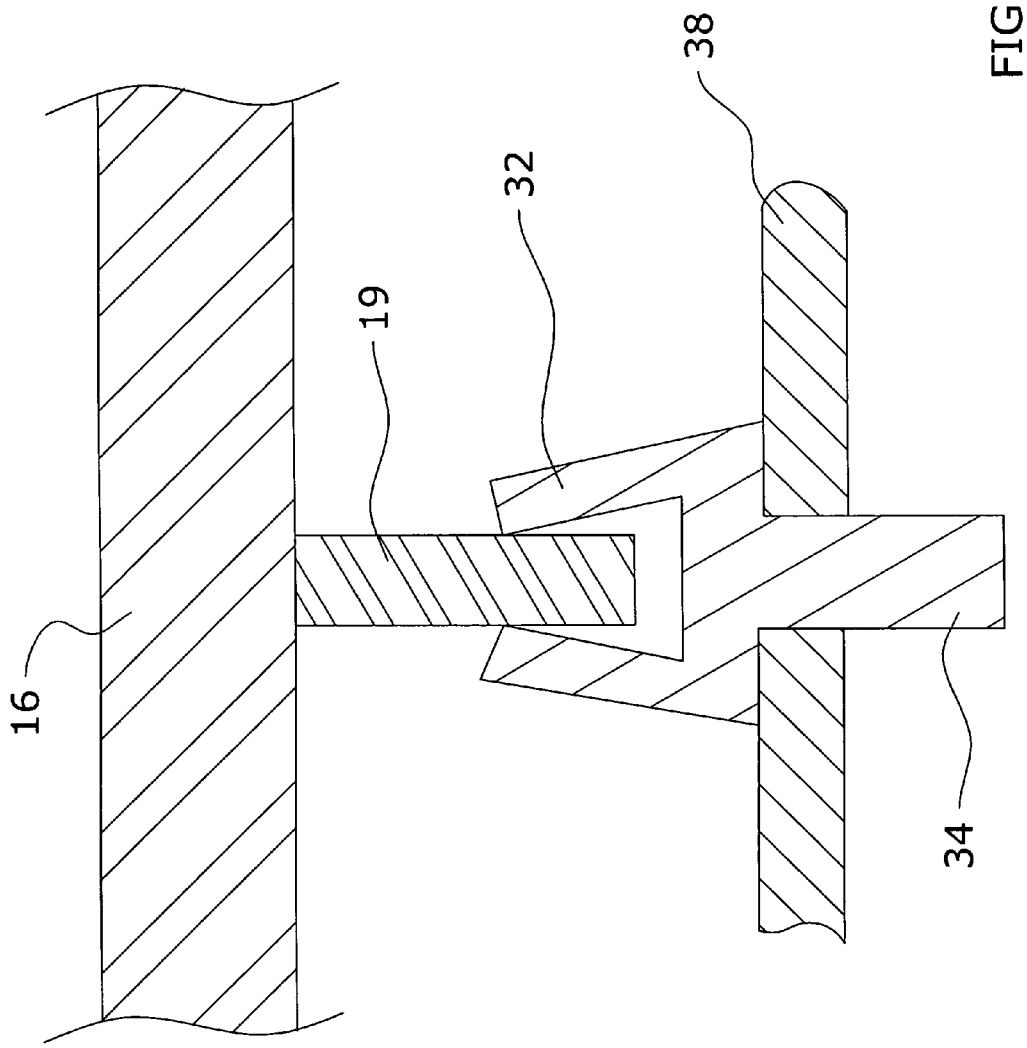
FIG. 11 is a side cutaway view of a device connector coupled within a first connector of the base portion.

The thermal management unit 20 has a plurality of first connectors 32 positioned within the chamber 50 of the thermal management unit 20 as best illustrated in FIGS. 2, 3 and 9 of the drawings. The first connectors 32 may be electrically coupled to device connectors 19 of an electronic device 16 as shown in FIG. 11 of the drawings. The first connectors 32 may be comprised of a pin grid array, a land grid array or a ball grid array or other connection structure capable of electrically communicating with an electronic device 16.

Figure 6:
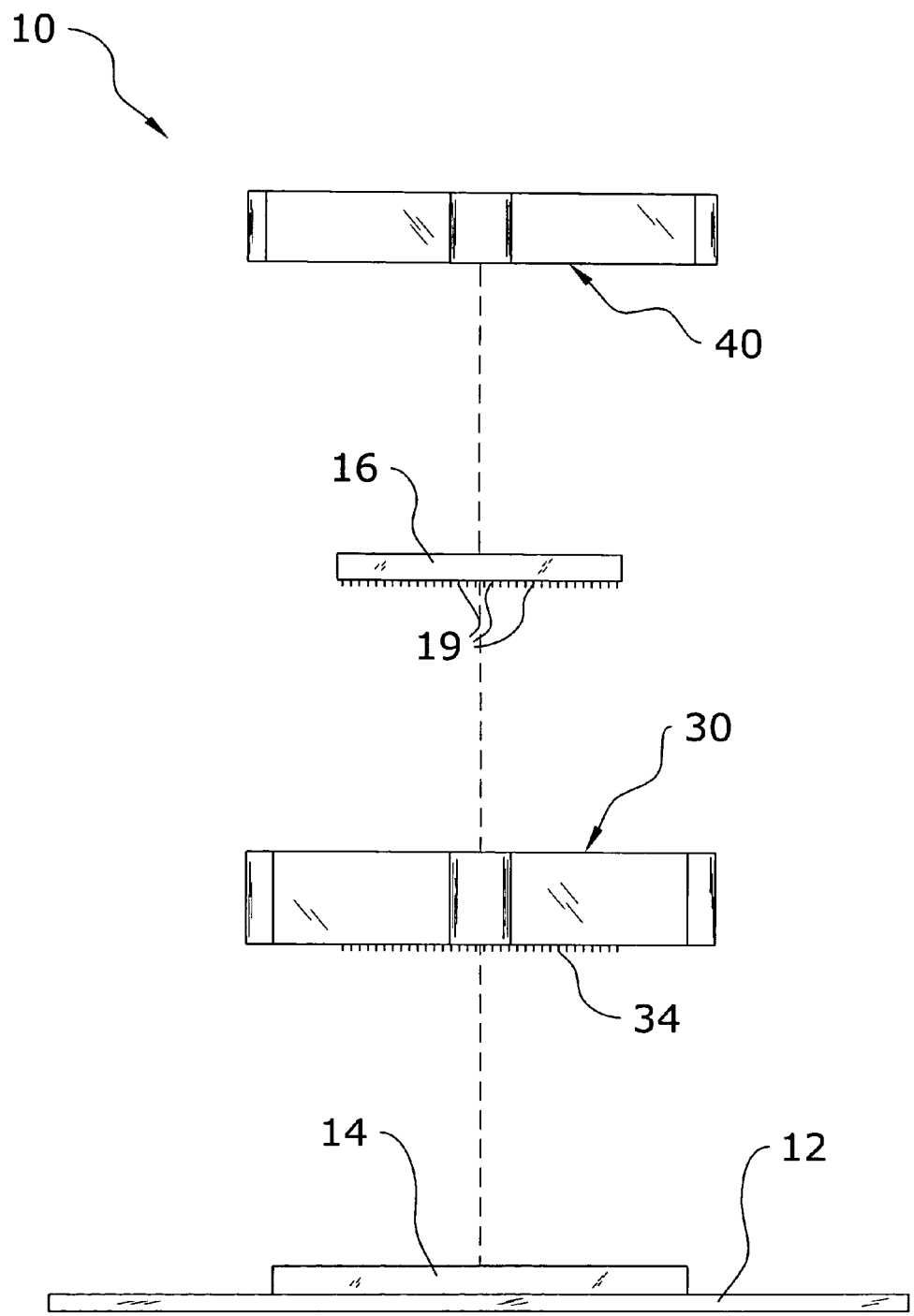
FIG. 6 is an exploded side view of the present invention with respect to a socket unit.
Figure 10:
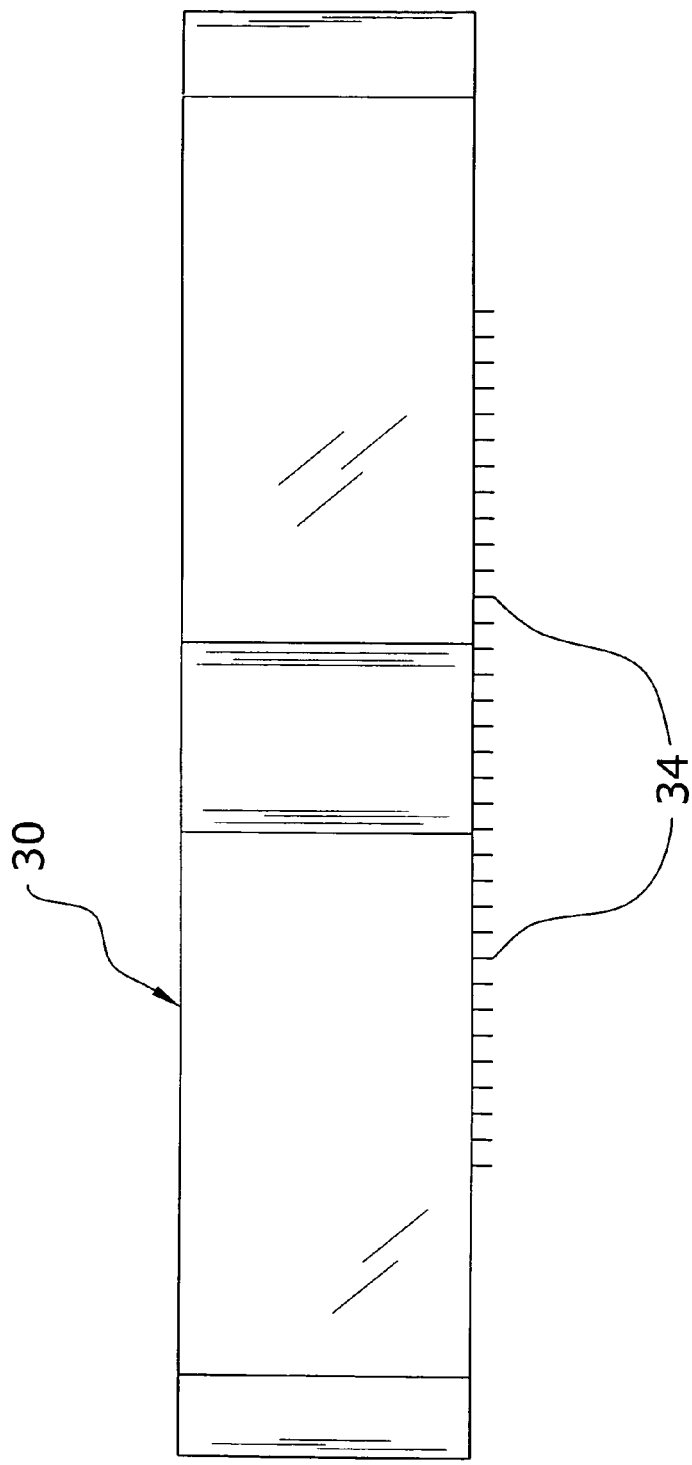
FIG. 10 is a side view of the base portion.

The thermal management unit 20 has a plurality of second connectors 34 as best illustrated in FIGS. 6 and 10 of the drawings. Each of the second connectors 34 are electrically coupled to the first connectors 32 as best illustrated in FIG. 11 of the drawings. The second connectors 34 extend exteriorly of the thermal management unit 20 for electrically coupling to at least one socket unit 14 or directly to a board 12. The second connectors 34 may be comprised of a pin grid array, a land grid array or a ball grid array or other connection structure capable of electrically communicating with a board 12.

The second connectors 34 may correspond to the position of the first connectors 32 as shown in FIG. 11 of the drawings. As further shown in FIG. 11 of the drawings, the first connectors 32 may correspond to the position of the device connectors 19 of the electronic device 16.

C. Base Portion

The thermal management unit 20 may be comprised of a combination base portion 30 and a cap member 40. The base portion 30 comprises a floor 38 and a sidewall 39 forming a cavity as best illustrated in FIGS. 7 and 8 of the drawings. The cavity is sufficient in size and shape to receive at least one electronic device 16 as illustrated in FIGS. 3, 7 and 8 of the drawings. The base portion 30 may have various shapes and structures other than illustrated in the drawings.

A seal 36 is preferably positioned between the edge of the base portion 30 and the edge of the cap member 40 for sealing the chamber 50 between thereof as shown in FIGS. 7 and 8 of the drawings. Various seal 36 structures may be utilized to seal 36 the cap member 40 to the base portion 30 as can be appreciated.

The first connectors 32 and the second connectors 34 may be attached within the floor 38 as shown in FIG. 11 of the drawings. The first connectors 32 and the second connectors 34 are each correspondingly coupled together as further shown in FIG. 11.

FIGS. 2 and 9 illustrate the first connectors 32 as having a receptacle structure in a pin grid array for receiving device connectors 19 comprised of a pin structure or related structure. As stated previously, the first connectors 32 may also be comprised of various other structures (e.g. raised structures, etc.) capable of usage in a ball grid array, land grid array and other connection systems for electronic devices 16. It can be appreciated that the base portion 30 may include a retaining structure to retain the electronic device 16 within the base portion 30 such as but not limited to levers, fasteners and snaps.

FIGS. 6 and 10 of the drawings illustrate the second connectors 34 as having a pin structure for electrically coupling within socket receptacles 15 of a socket unit 14. As stated previously, the second connectors 34 may also be comprised of various other structures (e.g. raised structures, etc.) capable of usage in a ball grid array, land grid array and other connection systems for electronic devices 16.

Alternatively, the second connectors 34 may be electrically and physically coupled to a board 12 similar to the connection between a conventional socket unit 14 and a board 12. Various connection methods may be utilized to connect the second connectors 34 directly to the board 12 such as but not limited to pins soldered into the board 12, ball grid arrays and land grid arrays.

D. Cap Member

The cap member 40 is attachable in a sealed manner to the base portion 30 as illustrated in FIGS. 7 and 8 of the drawings. The cap member 40 may have various shapes and structures other than illustrated in the drawings.

Figure 12:
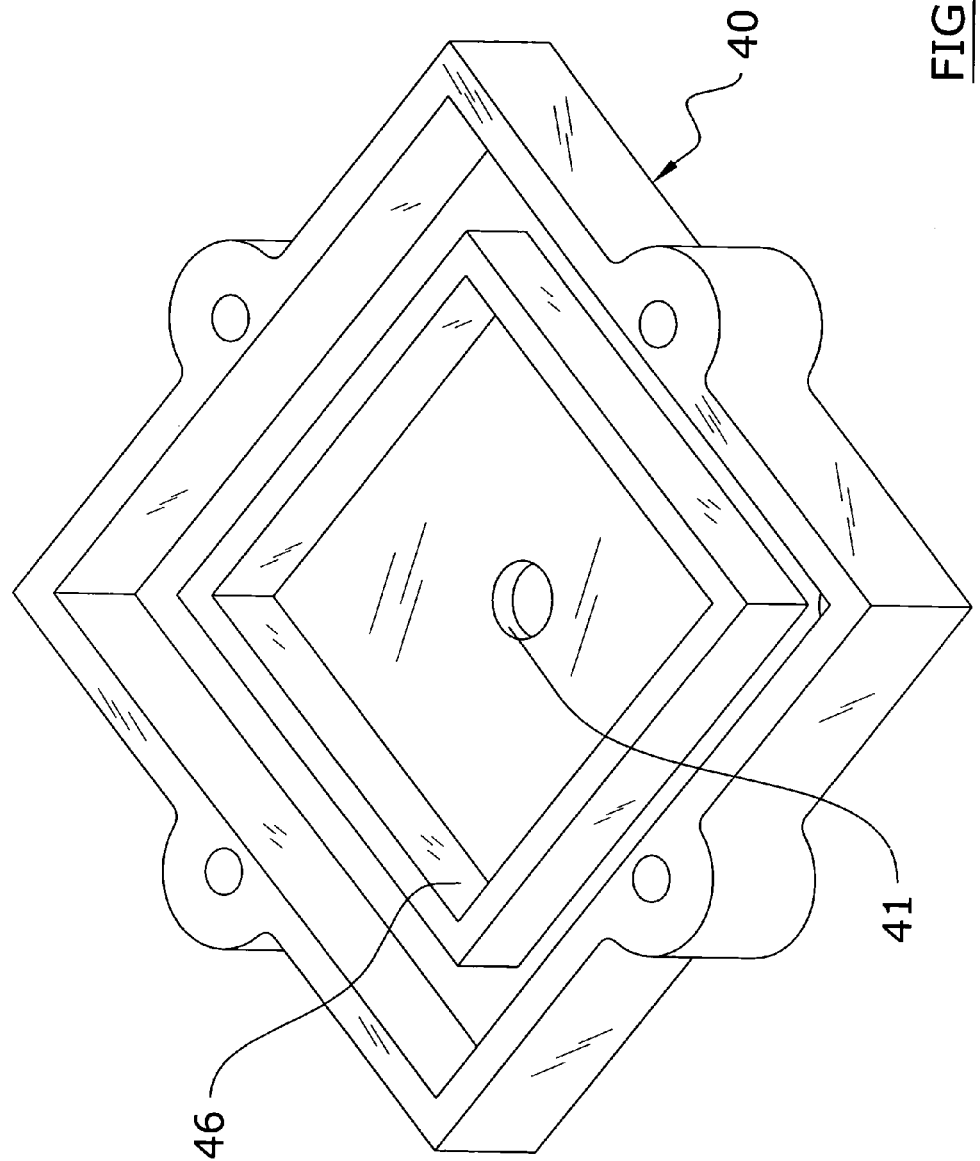
FIG. 12 is a perspective view of the inner portion of the cap member containing a raised vapor management protrusion.

The cap member 40 may be manufactured to dispense the liquid coolant (dielectric or non-dielectric) in either a spray cooling or liquid immersion application. FIGS. 7 and 12 illustrate utilizing the cap member 40 to dispense the liquid coolant in a spray cooling thermal management method. One or more nozzles 43 are positioned within the cap member 40 for spraying the coolant upon the electronic device 16. The coolant may be atomized through the nozzles 43 as illustrated in U.S. Pat. No. 5,860,602 and U.S. Pat. No. 6,016,969. The thermally conditioned liquid coolant enters the inlet port 41 and is then dispensed into the chamber 50 upon the electronic device 16 by the nozzles 43, thermally conditions the electronic device 16 through liquid immersion and then exits through the exit port as waste coolant to be thermally conditioned by the liquid thermal management system 60. As shown in FIG. 12 of the drawings, a vapor management protrusion 46 may be utilized within the cap member 40 to manage the vapor generated within the chamber 50. U.S. Pat. No. 5,220,804 illustrates a suitable vapor management protrusion 46. It can be appreciated that the inlet port 41 and the outlet port 42 may be positioned in various locations within the thermal management unit 20 such as also the base portion 30 and any combination thereof.

Figure 13:
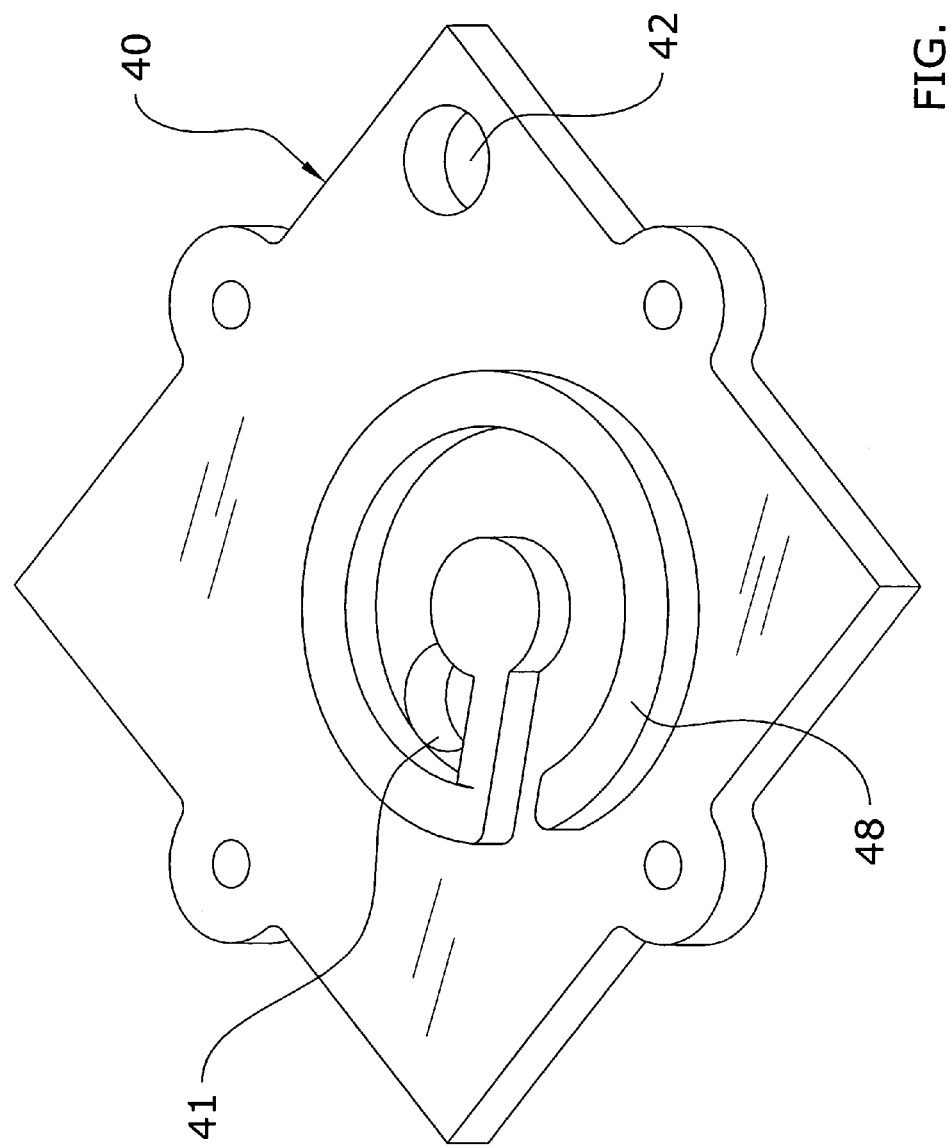
FIG. 13 is a perspective view of the inner portion of the cap member containing a raised fluid management protrusion.
Figure 14:
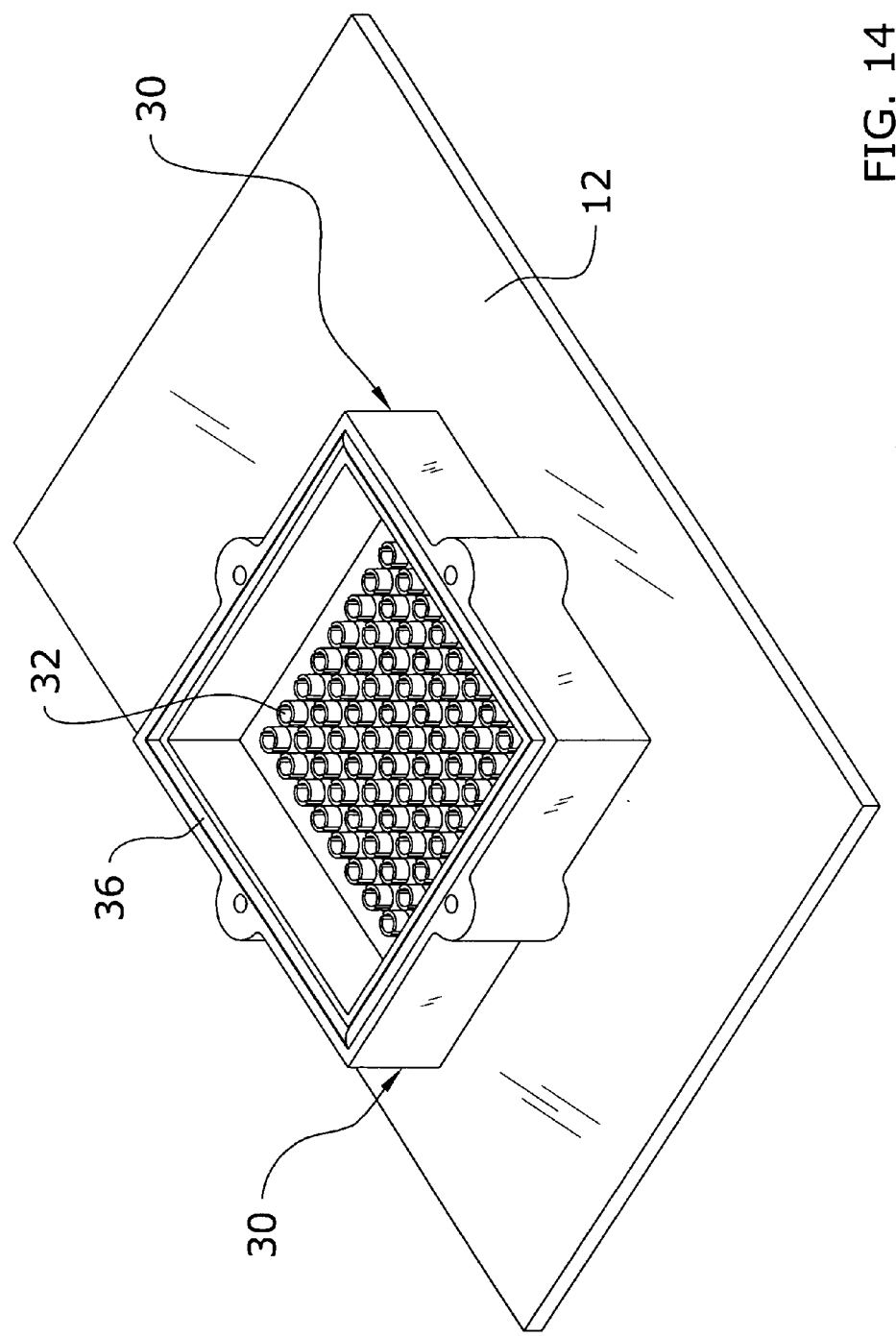
FIG. 14 is a perspective view of another embodiment of the present invention wherein the base portion is directly mounted to the board.

FIGS. 8 and 13 illustrate utilizing the cap member 40 to dispense the liquid coolant in a liquid immersion thermal management method. The thermally conditioned liquid coolant enters the inlet port 41 into the chamber 50, thermally conditions the electronic device 16 through liquid immersion and then exits through the exit port. As shown in FIG. 13, the cap member 40 may include a liquid management protrusion 48 that directs the liquid coolant in a path that reduces stagnation locations, such as a spiral pattern. It can be appreciated that the inlet port 41 and the outlet port 42 may be positioned in various locations within the thermal management unit 20 such as also the base portion 30 and any combination thereof.

FIG. 8 illustrates the usage of an encapsulant 44 between the electronic device 16 and the base portion 30 to prevent a non-dielectric coolant from making contact with the first connectors 32 and the device connectors 19. The encapsulant 44 can also be applied to surround and encase the first connectors 32 and the device connectors 19 (not shown).

E. Liquid Thermal Management System

The liquid thermal management system 60 is fluidly coupled to the chamber 50 for thermally managing an electronic device 16 by applying a liquid coolant to the electronic device 16. The liquid coolant may be comprised of a dielectric or non-dielectric depending upon the electronic device 16 being thermally managed. The liquid thermal management system 60 may be comprised of spray cooling or liquid immersion.

Applicant hereby incorporates by reference the following U.S. patents: U.S. Pat. No. 5,220,804 for a high heat flux evaporative cooling system; and U.S. Pat. No. 5,860,602 and U.S. Pat. No. 6,016,969, each for a laminated array of pressure swirl atomizers. Although a laminated pressure swirl atomizer array is hereby incorporated by reference, the present invention is not limited to such an apparatus, in fact, many dispensing means are applicable to the present invention including but not limited to inserted atomizers, jet orifices and incremental sprayers.

The liquid thermal management systems 60 described herein include a pump, tubing, and the means for removing heat from a cooling fluid (e.g. heat exchanger). These components are necessary for the operation of a liquid thermal management system 60 but are widely understood in the field, and thus will not be covered in detail. Configurations and details of the above components are not necessary for one skilled in the art to understand the present invention.

F. Operation of Present Invention

In use, the user may first electrically couple the thermal management unit 20 within one or more socket units 14 within a board 12 (or directly to the board 12) and then position the electronic device 16 within the thermal management unit 20. Alternatively, the electronic device 16 may be first positioned within the thermal management unit 20 (sealed or non-sealed) and then later install the thermal management unit 20 to the board 12 which does not require further explanation.

When electrically coupling the thermal management unit 20 to a socket unit 14, the user first aligns the second connectors 34 with the socket receptacles 15 of the socket unit 14 as shown in FIG. 3 of the drawings. The user then presses the thermal management unit 20 so that the second connectors 34 are electrically coupled within the socket receptacles 15 of the socket unit 14.

After the thermal management unit 20 is properly seated upon the socket unit 14, the user then positions one or more electronic devices 16 directly above the first connectors 32 so that the device connectors 19 correspond to the first connectors 32 as shown in FIG. 2 of the drawings. The user then presses the electronic device 16 downwardly into the base portion 30 of the thermal management unit 20 so that the device connectors 19 electrically couple with the first connectors 32 within the thermal management unit 20. Various mechanical devices may be secured to maintain the electronic device 16 in the desired position. An encapsulant 44 may be added about the electronic device 16 and/or first connectors 32 and device connectors 19 if desired.

Figure 4:
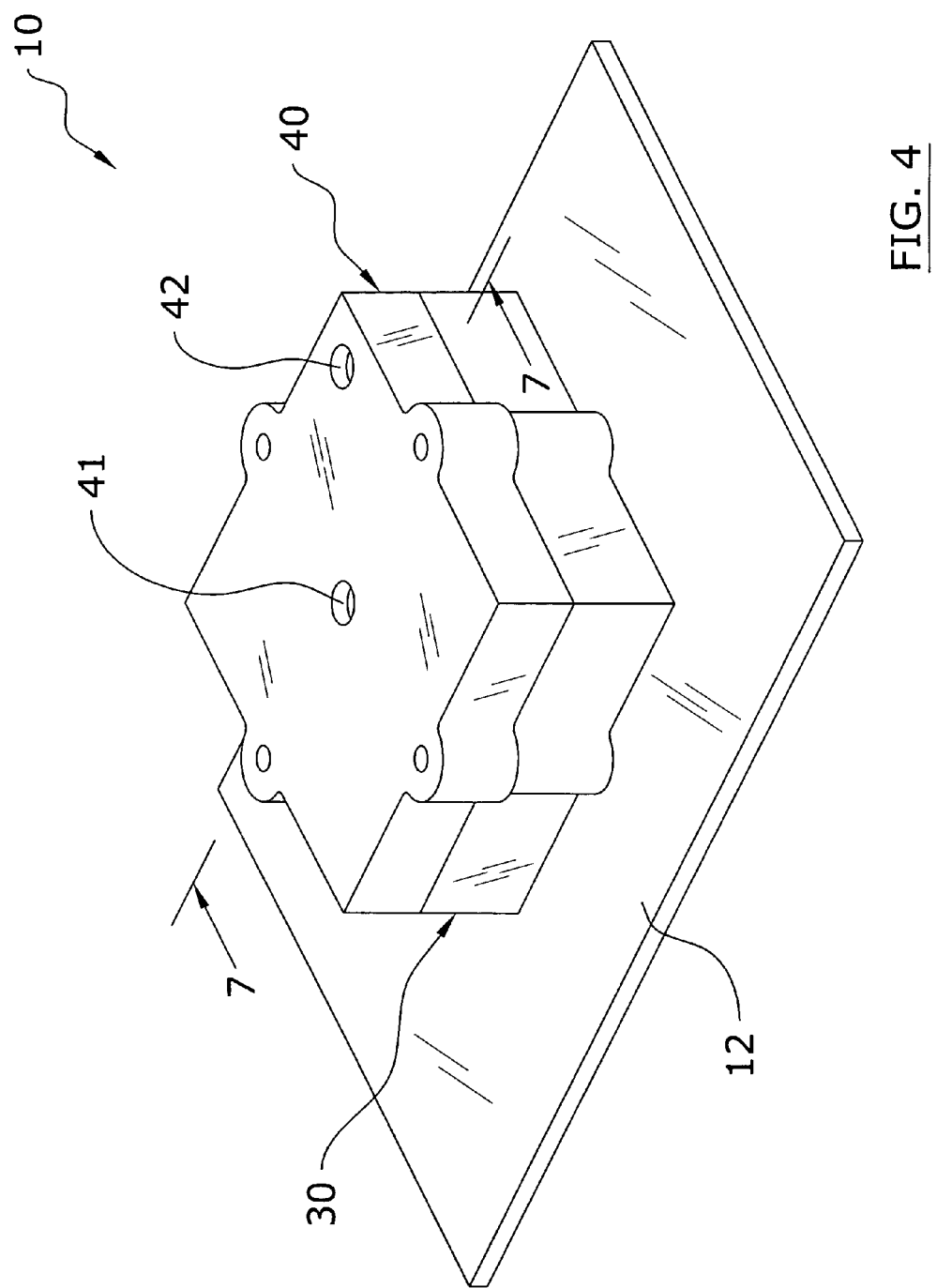
FIG. 4 is an upper perspective view of the present invention coupled to a socket unit (not seen) on a board.
Figure 5:
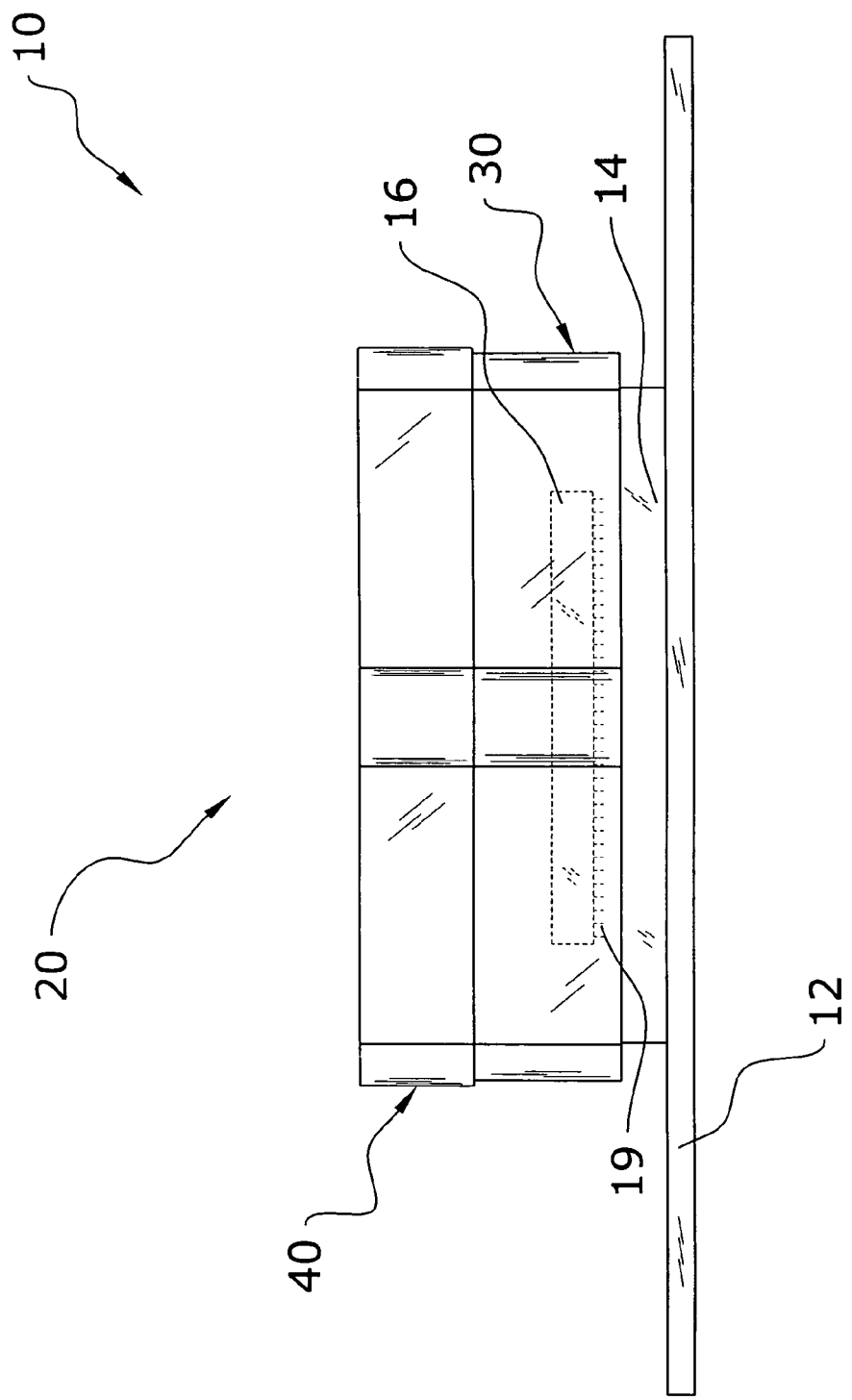
FIG. 5 is a side view of the present invention coupled to a socket with an electronic device contained within.
Figure 15:
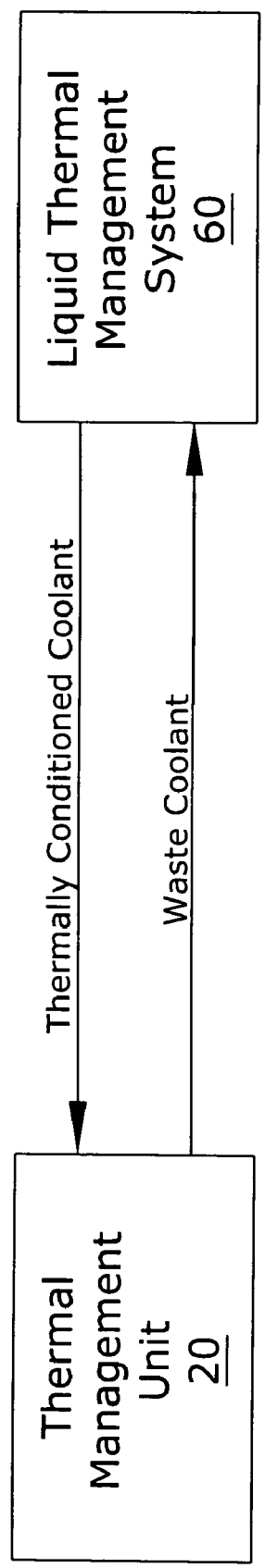
FIG. 15 is a block diagram illustrating the fluid connection between the thermal management unit and a liquid thermal management system.

The cap member 40 is then attached in a sealed manner to the base portion 30 as shown in FIGS. 4 and 5 of the drawings. The thermal management unit 20 is then fluidly connected to the liquid thermal management system 60 as shown in FIG. 15 of the drawings.

The electronic device 16 may then be activated which generates heat (or heated liquid coolant may be first applied to the electronic device 16 to achieve a desired temperature). The electronic device 16 electrically communicates and is communicated to through the electrical connection created between the respective device connectors 19, first connectors 32, second connectors 34 and the socket receptacles 15.

The thermally conditioned liquid coolant is directly applied to the electronic device 16 within the chamber 50. After the liquid coolant is heated (or cooled) from the electronic device 16, the waste coolant is then returned to the liquid thermal management system 60 for thermal conditioning and cleaning. It can be appreciated that the above method of use can be utilized in conjunction with pin grid arrays, ball grid arrays, land grid arrays and other connection systems.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A thermal management socket system, comprising:
    a thermal management unit having a chamber, wherein said chamber is to receive at least one electronic device and wherein said thermal management unit is to directly apply liquid coolant to said at least one electronic device within said chamber;
    a plurality of first connectors within said chamber of said thermal management unit, wherein said first connectors are adapted for electrically coupling with a corresponding plurality of device connectors of said at least one electronic device; and
    a plurality of second connectors extending out from said thermal management unit, wherein said second connectors are electrically coupled to said first connectors and wherein said second connectors are adapted for removably and electrically coupling to a socket on a board.

2. The thermal management socket system of claim 1, including a liquid thermal management system coupled to said chamber for thermally managing said at least one electronic device.

3. The thermal management socket system of claim 2, wherein said liquid thermal management system is comprised of spray cooling.

4. The thermal management socket system of claim 2, wherein said liquid thermal management system is comprised of liquid immersion.

5. The thermal management socket system of claim 1, wherein said first connectors are each comprised of a receptacle structure capable of receiving a corresponding device connector from said at least one electronic device.

6. The thermal management socket system of claim 1, wherein said first connectors are each comprised of a raised structure capable of electrically coupling with said at least one electronic device utilizing a ball grid array or a land grid array.

7. The thermal management socket system of claim 1, wherein said thermal management unit is comprised of a base portion containing said first connectors and said second connectors, and a cap member removably connectable to said base portion for defining said chamber.

8. A method of assembling a thermal management system for thermally managing at least one electronic device, said method comprising the steps of:
    providing a board including at least one socket permanently attached to said board;
    providing a thermal management unit including a chamber, a plurality of first connectors within said chamber, and a plurality of second connectors extending out from said thermal management unit, wherein said second connectors are electrically coupled to said first connectors and wherein said thermal management unit is to directly apply liquid coolant to said at least one electronic device within said chamber;
    positioning at least one electronic device within said chamber of said thermal management unit and electrically coupling said at least one electronic device to said plurality of first connectors; and
    electrically and detachably coupling said second connectors to said at least one socket.

9. The method of utilizing a thermal management unit of claim 8, including the step of sealing said thermal management unit about said at least one electronic device.

10. The method of utilizing a thermal management unit of claim 8, including attaching a cap member in a sealed manner to a base portion of said thermal management unit.

11. The method of assembling a thermal management system of claim 8, including the step of fluidly connecting said thermal management unit to a liquid thermal management system.

12. A thermal management apparatus for thermally managing at least one electronic device, comprising a thermal management unit to receive at least one electronic device, wherein said thermal management unit is to directly apply liquid coolant to said at least one electronic device, said thermal management unit including a plurality of first connectors, and a plurality of second connectors electrically coupled to said first connectors and extending out from said thermal management unit, wherein said second connectors are electrically and removably coupled to a socket on a board.

13. The thermal management apparatus of claim 12, including a liquid thermal management system coupled to said thermal management unit.

14. The thermal management apparatus of claim 13, wherein said liquid thermal management system is comprised of spray cooling.

15. The thermal management apparatus of claim 13, wherein said liquid thermal management system is comprised of liquid immersion.

* * * * *